United States Patent [19]

Ukai et al.

[11] Patent Number: 4,816,638
[45] Date of Patent: Mar. 28, 1989

[54] SINGLE SLICE PROCESSING APPARATUS WITH LATCH PROCESSING LOAD-LOCK CHAMBER FOR HEATING THE SUBSTRATES AND PLASMA PROCESSING

[75] Inventors: Katsumi Ukai; Tsutomu Tsukada; Kouji Ikeda; Toshio Adachi, all of Fuchu, Japan

[73] Assignee: Anelva Corporation, Tokyo, Japan

[21] Appl. No.: 110,253

[22] Filed: Oct. 20, 1987

[30] Foreign Application Priority Data

Feb. 20, 1987 [JP] Japan .................. 62-37654

[51] Int. Cl.$^4$ ............................................. B23K 9/00
[52] U.S. Cl. ........................ 219/121.43; 219/121.4; 219/121.58; 156/345; 204/192.1
[58] Field of Search ............... 219/121 PD, 121 PG, 219/121 PE, 121.58; 156/643, 646, 345; 204/298, 192.1; 427/34

[56] References Cited

U.S. PATENT DOCUMENTS

| | | | |
|---|---|---|---|
| 4,149,923 | 4/1979 | Uehara et al. | 156/345 |
| 4,201,579 | 5/1980 | Robinson et al. | 156/345 |
| 4,252,595 | 2/1981 | Yamamoto et al. | 156/345 |
| 4,318,767 | 3/1982 | Hijikata et al. | 219/121 PG |
| 4,412,771 | 11/1983 | Gerlach et al. | 219/121 PG |
| 4,526,643 | 7/1985 | Okano et al. | 156/345 |
| 4,563,240 | 1/1986 | Shibata et al. | 156/345 |
| 4,657,620 | 4/1987 | Davis et al. | 156/345 |
| 4,693,777 | 9/1987 | Hazano et al. | 156/345 |
| 4,699,689 | 10/1987 | Bersin | 156/345 |
| 4,715,921 | 12/1987 | Maher et al. | 156/345 |

OTHER PUBLICATIONS

IBM Technical Disclosure Bulletin, vol. 25, #10, Mar. 1983.

Primary Examiner—M. H. Paschall
Attorney, Agent, or Firm—Pollock, VandeSande & Priddy

[57] ABSTRACT

A vacuum processing apparatus comprising a load-lock chamber, a vacuum transferring chamber and a processing chamber respectively having evacuating systems for evacuating the respective chambers. The load-lock chamber has a first isolation valve for isolating and opening communication of the load-lock chamber with the atmosphere and a second isolating valve for isolating and opening communication of the load-lock chamber with the vacuum transferring chamber. The processing chamber comprises a vessel detachably located at an arranging aperture formed in a wall of the vacuum transferring chamber and closing the arranging aperture in an air-tight manner from the outside of the apparatus. A substrate arranging portion is arranged in the vacuum transferring chamber so as to be move toward and away from the vessel to form an air-tight chamber space in the vessel isolated from the vacuum transferring chamber when the substrate arranging portion has moved to the vessel. The vacuum transferring chamber comprises therein a substrate transferring mechanism for transferring the substrates along transferring passages in the vacuum transferring chamber. The substrate arranging portion comprises a substrate lifter for moving the substrate between the transferring passages and the substrate arranging portion.

6 Claims, 3 Drawing Sheets

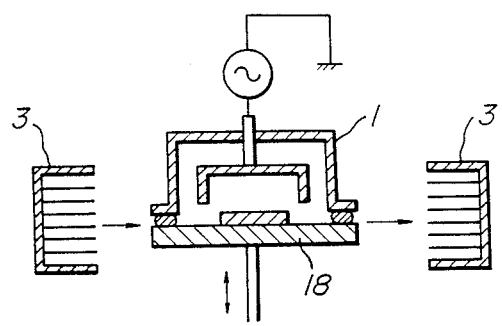
FIG_1 PRIOR ART
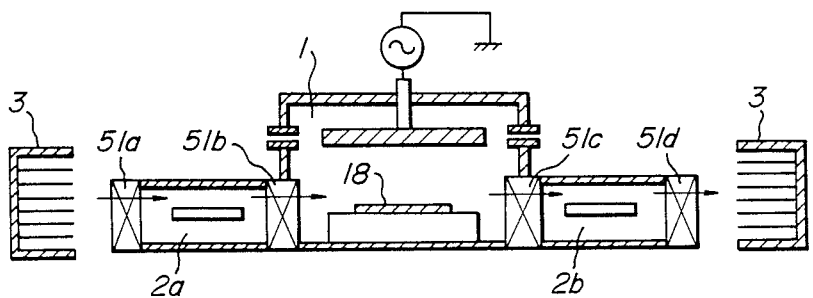
FIG_2 PRIOR ART
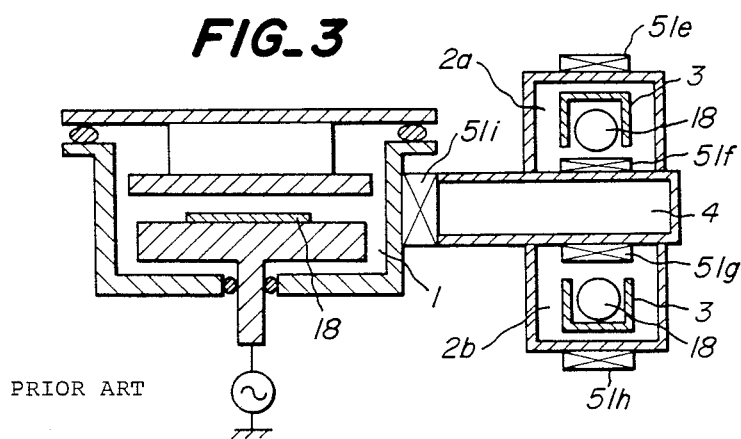
FIG_3 PRIOR ART

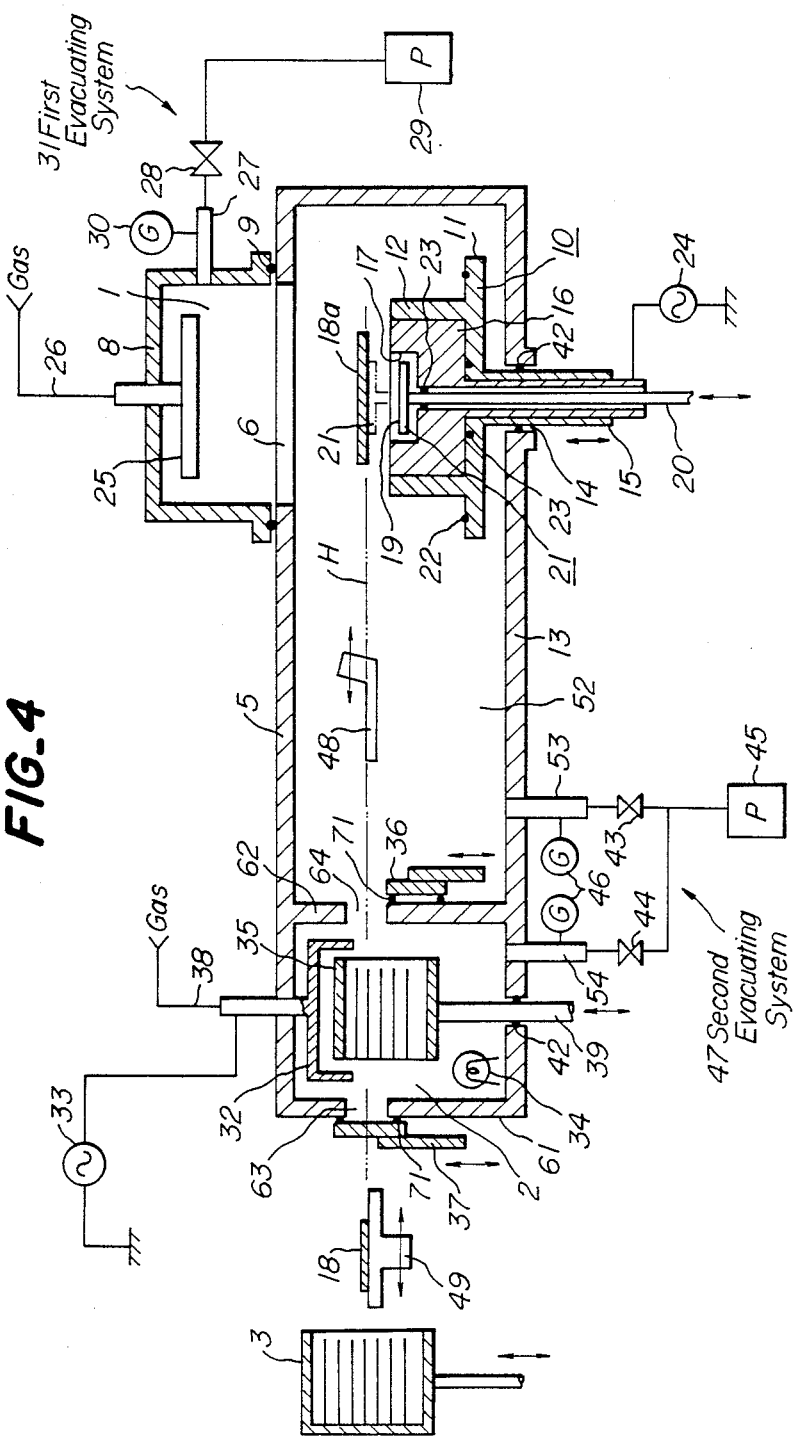

SINGLE SLICE PROCESSING APPARATUS WITH BATCH PROCESSING LOAD-LOCK CHAMBER FOR HEATING THE SUBSTRATES AND PLASMA PROCESSING

BACKGROUND OF THE INVENTION

This invention relates to a vacuum processing apparatus for surface treatment of a substrate in vacuum.

Surface treatment apparatuses using plasma have been publicly known as vacuum processing apparatuses of this kind. Particularly, dry etching apparatuses using reactive gas plasma have been widely used in semiconductor element production.

Apparatuses shown in FIGS. 1-3 have been widely used as the dry etching apparatuses. The apparatus shown in FIG. 1 is of a batch processing type wherein every time a substrate is loaded or unloaded, a processing chamber 1 is exposed to the atmosphere and after the substrate 18 is loaded, the processing chamber is evacuated and the vacuum processing is effected.

The apparatus shown in FIG. 2 comprises a processing chamber 1, a load-lock chamber 2a having a valve 51a and a valve 51b connecting the chambers 1 and 2a, and a further unload-lock chamber 2b having a valve 51c connecting the chambers 1 and 2b and a valve 51d. Substrates 18 arranged in the atmosphere are fed one by one from a substrate holder 3 through the opened valve 51a into the load-lock chamber 2a. The substrate 18 is further fed from the load-lock chamber 2a through the valve 51b into the processing chamber 1 in which the substrate 18 is processed in a predetermined manner. Thereafter, the processed substrate 18 is fed through the valve 51c into the unload-lock chamber 2b and further fed through the valve 51d into a substrate holder 3 in the atmosphere. This apparatus is a processing apparatus having so-called vacuum-tight mechanisms.

With the apparatus shown in FIG. 3, substrates 18 together with a substrate holder 3 accommodating the substrates are introduced into a load-lock chamber 2a having a large volume. The substrates 18 are transferred one by one through a substrate transferring chamber 4 arranged between a processing chamber 1 and the load-lock chamber 2a into the processing chamber 1 in which the substrate 18 is processed. Then, the substrate 18 is restored again through the substrate transferring chamber 4 into a unload-lock chamber 2b having a large volume and having a substrate holder 3. Thereafter, the substrate is taken out of the unload-lock chamber 2b into the atmosphere. Reference numerals 51e and 51i denote valves.

However, these apparatuses have various disadvantages. With the apparatus shown in FIG. 1, when the substrate is fed into or removed from the processing chamber 1, the air enters the processing chamber so that moisture ($H_2O$) in the air will deposit on inner walls of the processing chamber 1. Therefore, in the stage of processing the substrate in the processing chamber 1 kept evacuated, the deposited gas (almost as $H_2O$) is evacuated which considerably detrimentally affects the reproducibility of etching performance.

In the apparatus shown in FIG. 2, when the substrate 18 is fed into or removed from the processing chamber 1, such a movement of the substrate is effected through the load-lock chamber 2a and the unload-lock chamber 2b so that the air is prevented from entering the processing chamber 1 to an appropriate extent in comparison with the apparatus shown in FIG. 1. When one cycle is effected in a short period of time or 2-3 minutes, which consists of vacuum processing of substrate in the vacuum chamber 1, removing it from the chamber and introducing a next substrate into the chamber, the airtightness of the vacuum chamber is not enough because the inlet and outlet of the chamber 1 for the substrates are separately provided. Therefore, there is a detrimental affect of deposited gases similar to that in the apparatus shown in FIG. 1 to make it impossible to accomplish the stable substrate processing (etching). Moreover, another problem often arises in that when a substrate made of aluminium is taken out of the processing chamber into the atmosphere after it has been etched, the moisture ($H_2O$) in the atmosphere is deposited on the substrate so that it causes corrosion of aluminium patterns on the substrate, thereby considerably lowering the yield rate of the products.

With these apparatuses shown in FIGS. 1-3, moreover, it is necessary to change basic members such as parts in the processing chamber 1 and the construction of the chamber itself in the event that the processing mode of substrate is changed.

In this case, transference mechanisms (not shown) and the processing chamber 1 need to be modified in a complicated manner particularly with the apparatuses shown in FIGS. 2 and 3 wherein the load-lock chamber 2a and the unload-lock chamber 2b or the vacuum transferring chamber 4 exclusively provided adjacent to the processing chamber 1 and the transference mechanisms are distributed in the respective chambers. In order to avoid such complicated modifications, vacuum processing apparatuses tend generally to become exclusive apparatuses according to applications. On the other hand, this is a great handicap for development of multipurpose apparatuses.

SUMMARY OF THE INVENTION

It is a principal object of the invention to provide an improved vacuum processing apparatus which solves the above problems of the prior art and which is capable of preventing the contamination of a processing chamber caused by entrance of the air into the chamber and has superior processing performance in vacuum and which is able to provide for change in substrate processing mode and therefore is able to be used for multipurposes.

In order to achieve this object, in a vacuum processing apparatus including a load-lock chamber, a vacuum transferring chamber and a processing chamber respectively having evacuating means, said load-lock chamber receiving a plurality of substrates from outside of the apparatus, feeding therefrom the substrates into the vacuum transferring chamber, receiving processed substrates from said vacuum transferring chamber, and removing therefrom the processed substrates out of the apparatus, and said processing chamber receiving said substrates from said vacuum transferring chamber, processing the substrates, and feeding therefrom the processed substrates into said vacuum transferring chamber. According the invention the load-lock chamber comprises first isolating valve means for isolating and communicating between the inside of said load-lock chamber and the outside of the apparatus and second isolating valve means for isolating and communicating between the inside of the load-lock chamber and the inside of the vacuum transferring chamber, and said processing chamber comprises a vessel detachably located at an arranging aperture formed in a wall of said vacuum transferring chamber and closing said arranging aperture in an air-tight manner from the outside of the apparatus, and a substrate arranging portion arranged in said vacuum transferring chamber in opposition to said vessel and movable toward and away from said vessel wall to form an air-tight chamber space in said vessel isolated from said vacuum transferring chamber when said substrate arranging portion has moved to said vessel wall, and further said vacuum transferring chamber comprises therein substrate transferring means for transferring the substrates and processed substrates along transferring passages in the vacuum transferring chamber and said substrate arranging portion comprises substrate lifter means for moving the substrates between said transferring passages and said substrate arranging portion.

With the above arrangement of the apparatus according to the invention, in vacuum processing the substrates, the transference of them between the load-lock chamber and the processing chamber respectively and the vacuum transferring chamber is effected as follows.

First, for example, the load-lock chamber is isolated in an air-tight manner from the vacuum transferring chamber and the processing chamber, and thereafter the vacuum transferring chamber and the processing chamber are evacuated by means of the evacuating systems. At the same time, all substrates in a substrate holder arranged in the atmosphere are transferred into a substrate holder in the load-lock chamber by means of an arm or fork transferring mechanism to complete an introduction of substrates from the outside of the apparatus into the load-lock chamber. The load-lock chamber is then evacuated by the evacuating system, while the vacuum transferring chamber and the processing chamber have been evacuated to a certain extent. When the vacuum transferring chamber and the processing chamber become under a predetermined vacuum condition, the load-lock chamber is communicated with the vacuum transferring chamber and the processing chamber by opening the second isolation valve. The transferring mechanism, such as rotary arms, linear forks and the like is then actuated to transfer the substrates in the substrate holder in the load-lock chamber to a location immediately above the substrate arranging portion. On the termination of the transference of the substrates, the substrate lifter is actuated to locate the substrates on the substrate arranging portion of the processing chamber. Thereafter the substrate arranging portion is moved toward the processing chamber to isolate in an air-tight manner the processing chamber from the vacuum transferring chamber. The substrates are then processed in vacuum in the vacuum processing chamber.

On the other hand, substrates in the substrate holder in the load-lock chamber are maintained under the predetermined vacuum condition and are waiting for the completion of the processing of the substrates in the processing chamber. After the completion of the processing, the processed substrates are replaced with substrates which have not been processed in the load-lock chamber by the operation of the substrate transferring mechanism. As a result, the substrates which have not been processed are located on the substrate arranging portion, while the processed substrates are located in the substrate holder in the load-lock chamber.

Thereafter, the above operation is repeated to complete the processing of all the substrates. At that moment, the load-lock chamber is again isolated in an air-tight manner from the vacuum transferring chamber and the processing chamber, and the substrates are processed with the aid of heating means or discharge producing means provided in the load-lock chamber before the substrates are removed out of the apparatus. Thereafter, the air is introduced into the load-lock chamber and all the substrates are then transferred into a substrate holder arranged out of the apparatus by means of a substrate transferring mechanism.

The invention will be more fully understood by referring to the following detailed specification and claims taken in connection with the appended drawings.

BRIEF DESCRIPTION OF THE DRAWINGS

FIGS. 1, 2 and 3 illustrate apparatuses of the prior art;

FIG. 4 is a sectional view of one embodiment of the vacuum processing apparatus according to the invention.

DESCRIPTION OF THE PREFERRED EMBODIMENTS

Figure 5:
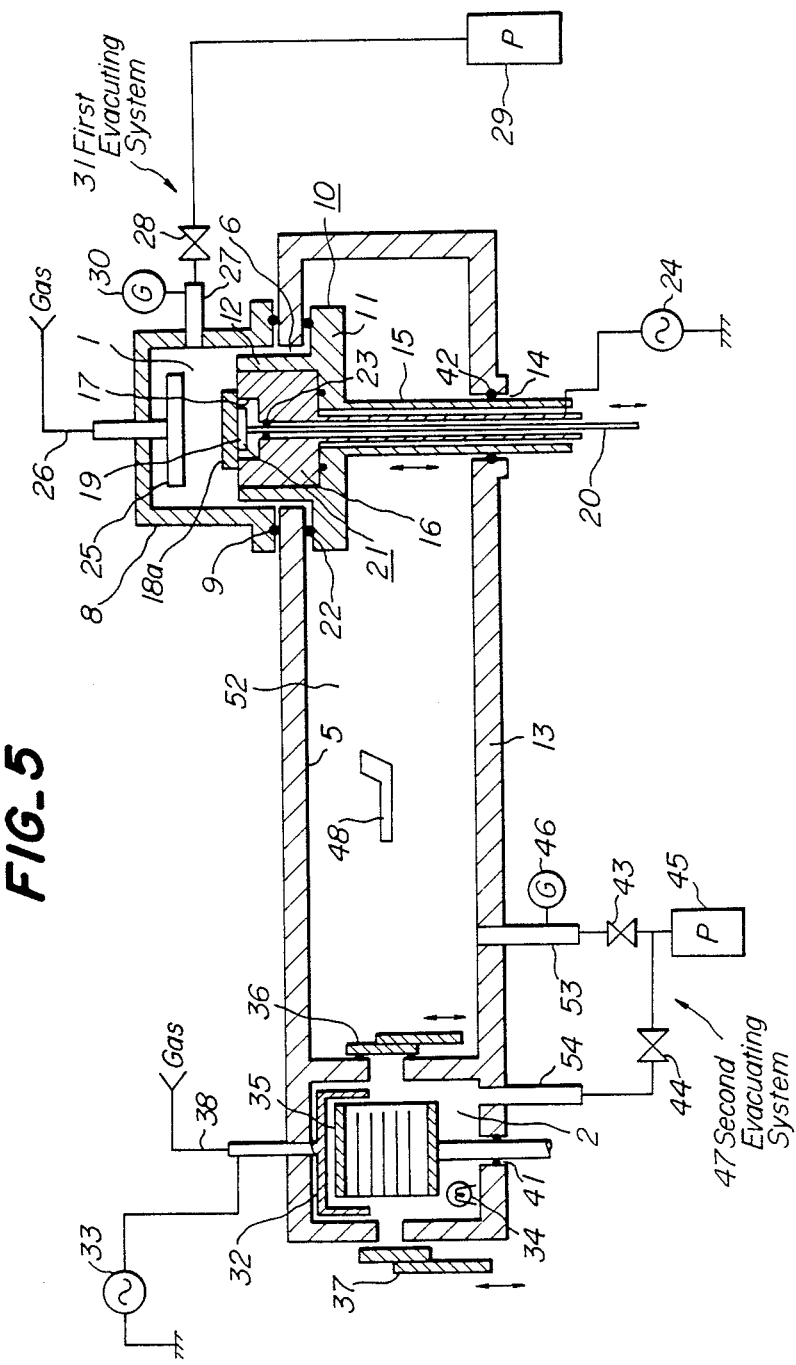
FIG. 5 is a sectional view of the apparatus shown in FIG. 4 illustrating the operation of the apparatus.

FIG. 4 illustrates in section a vacuum processing of one embodiment of the invention comprising a vacuum transferring chamber 52 whose upper wall 5 is formed with an arranging aperture 6. A processing vessel 8 is detachably provided on the upper wall 5 of the chamber 52 so as to cover the arranging aperture 6. Between the processing vessel 8 and the upper wall 5, a sealing member 9 is provided to seal the processing vessel 8 from the atmosphere in an air-tight manner.

On the other hand, a substrate arranging portion 10 is provided below the arranging aperture 6 and in opposition to the processing vessel 8. The substrate arranging portion 10 comprises an air-tight plate 11 in the form of a flat plate, a cylindrical wall 12 standing upright from an upper surface of the air-tight plate 11 and adapted to insert into the arranging aperture 6, and a driving shaft 15 in the form of a pipe depending from a lower surface of the air-tight plate 11.

The driving shaft 15 extends downward through an insert aperture 14 formed in a bottom wall 13 of the vacuum transferring chamber 52 in an air-tight manner with the aid of a sealing member 42. A first electrode 16 is fitted in the cylindrical wall 12 and a center aperture of the substrate arranging portion 10 through an insulator (not shown) in an upright manner on the air-tight plate 11. The first electrode 16 is formed in its upper surface with a recess 17, and a substrate 18a is arranged above the first electrode 16 so as to cover it.

In the recess 17 is arranged an upward pushing plate 19 provided with an upward pushing rod 20 depending from a center of the upward pushing plate 19 and extending through a center aperture of the first electrode 16 out of the vacuum transferring chamber 52. The upward pushing plate 19 and the upward pushing rod 20 form a substrate lifter 21 for lifting the substrate 18a. A lower end of the upward pushing rod 20 is connected to a vertically driving mechanism (not shown). The substrate 18a is upwardly driven by actuating the vertically driving mechanism.

Moreover, the driving shaft 15 of the substrate arranging portion 10 is also connected to a vertically driving mechanism (not shown). By actuating this vertically driving mechanism, for example, the substrate arranging portion 10 is upwardly driven to form a space as a processing chamber 1 between the substrate arranging portion 10 and the processing vessel 8 as shown in FIG. 5.

In this case, a sealing member 22 is fitted in the upper surface of the air-tight plate 11 at an outer circumference to accomplish an air-tight contact between an inner surface (lower surface) of the upper wall 5 and the air-tight plate 11. In order to seal the processing chamber from the vacuum transferring chamber 52 in an air-tight manner, moreover, sealing members 23 are interposed between the air-tight plate 11 and the first electrode 16 and between the upward pushing rod 20 and a center aperture wall of the first electrode 16. The first electrode 16 is connected to a radio frequency power source 24.

On the other hand, a second electrode 25 is arranged in the processing vessel 8 so as to be in opposition to the substrate 18a. Direct current voltage or radio frequency voltage from a power source (not shown) is sometimes applied to the second electrode 25. Provision of such a second electrode 25 supplied with the direct current voltage or radio frequency voltage serves to control energy of ions incident on the substrate 18a. In contrast therewith, the direct current voltage may be applied to the first electrode 16 and the radio frequency may be applied to the second electrode 25. These relations between the electrodes and voltage sources are dependent upon substrates to be processed. A gas introduction system 26 is connected to the second electrode 25 so that an introduced gas is jetted against the substrate 18a through a plurality of apertures formed in the second electrode 25.

Moreover, to the processing vessel 8 is connected a first evacuating system 31 comprising an evacuating port 27, a valve 28, a vacuum pump 29 and a vacuum gage 30. Various kinds of pumps may be used as the vacuum pump such as any one or a combination of rotary oil pump, mechanical Root's blower pump, oil diffusion pump, turbo-molecular pump and cryopump. Between the processing chamber 1 and the vacuum pump 29, a variable conductance may be provided as an element of the first evacuating system 31 for controlling the pressure in the processing chamber 1 at a constant value, as the case may be. A trap may be provided upstream and/or downstream of the vacuum pump 29 for removing noxious gas components.

A load-lock chamber 2 is separated from the vacuum transferring chamber by a partition wall 62 and is provided therewith a substrate holder 35 capable of accommodating all substrates 18 housed in a substrate holder 3 on an atmospheric side. After an isolation valve 37 provided at an arranging aperture 63 of a side wall 61 is opened, each substrate 18 is fed from the substrate holder 3 on the atmospheric side into the load-lock chamber along a substrate transferring line H with the aid of a substrate transferring mechanism 49. On termination of transferring all the substrates, the isolation valve 37 is closed and the load-lock chamber 2 is evacuated by a second evacuating system 47 connected to an evacuating port 54 provided at the load-lock chamber 2 until the load-lock chamber 2 arrives at a predetermined vacuum pressure After the predetermined vacuum pressure in the load-lock chamber 2 is obtained, an isolation valve 36 provided at an arranging aperture 64 of the partition wall 62 is opened to cause the load-lock chamber 2 to communicate with the vacuum transferring chamber 52. Thereafter, one substrate is transferred along the substrate transferring line or passage H by a substrate transferring mechanism 48 to a position immediately above the first electrode 16 of the substrate arranging portion 10. Then the substrate is arranged on the first electrode 16 with the aid of the substrate lifter 21.

The processing of the substrate is then effected in the manner as above described.

During the above transference and processing of the substrates, the load-lock chamber 2 and the vacuum transferring chamber 52 are maintained at the vacuum pressure by the second evacuating system 47. A constitution of the system 47 may be similar to that of the first evacuating system.

After all the substrates housed in the substrate holder 35 have been processed in this manner, the isolation valve 36 is closed to separate the load-lock chamber 2 from the vacuum transferring chamber 52 and another vacuum process is applied to the substrates in the substrate holder 35. Such a vacuum process may be irradiation of light from a lamp 34 or plasma irradiation by a third electrode 32. In the irradiation process by the lamp 34, for example, heating by an infrared lamp or treatment by light excitation process with an ultraviolet lamp and an active gas is effected. In the plasma irradiation process, radio frequency plasma processing with a radio frequency power source 33 or $\mu$ wave discharge with a $\mu$ wave power source is effected. During such a processing, the load-lock chamber 2 is being evacuated by a vacuum pump 45 through an evacuating port 54 provided at the bottom of the load-lock chamber 2 and a valve 44. A variable conductance or the like may be provided between the load-lock chamber 2 and the vacuum pump 45 for controlling the vacuum pressure in the load-lock chamber 2. A trap may be provided upstream and/or downstream of the vacuum pump 45 for removing the active gas. After the vacuum processing in the load-lock chamber 2 has been completed, the isolation valve 37 is opened and the substrates in the substrate holder 35 are transferred into the substrate holder 3 arranged in the atmosphere by means of the substrate transferring mechanism 49 to complete the series of the processings.

Although an O-ring seal 42 is used for sealing a driving shaft 39 for vertically moving the substrate holder 35 in the load-lock chamber in this embodiment shown in FIG. 4, bellows may be used for this purpose.

The same holds true in a seal 42 for the vertically driving shaft 15 of the substrate arranging portion 10.

In this embodiment, there is provided only one substrate holder 3 in the proximity of the vacuum transferring chamber for transferring the substrates into and from the substrate holder 35 provided in the load-lock chamber 2.

Moreover, the substrate transferring mechanisms 49 and 48 provided in the atmosphere and in the chamber 52 comprise rotary arms, linear movement forks and the like which are publicly known.

The operation of the apparatus of this embodiment constructed as above described will be explained by referring to FIGS. 4 and 5.

Under the condition shown in FIG. 4, the substrate arranging portion 10 is at the substrate transferring position and the isolation valve 36 of the load-lock chamber is opened, so that the processing chamber 1, the load-lock chamber 2 and the vacuum transferring chamber 52 are under a high vacuum condition with the evacuating action of the second evacuating system 47. When a great amount of gases must be exhausted from the vacuum chambers, as after all the chambers have been opened to the atmosphere, the first evacuating system 31 may be used in addition to the system 47.

Such an evacuating action to a high extent serves to force absorbed gases in the processing chamber into the atmosphere and also serves to force absorbed gases on unetched substrates into the atmosphere. When etching aluminium substrates, moreover, the above evacuating action also serves to remove chlorine ions absorbed on the processed substrates or to prevent aftercorrosion.

FIG. 5 illustrates the processing chamber 1 and the load-lock chamber 2 in which processing is being carried out.

The purpose of the load-lock chamber in this embodiment is to effect the aftertreatment of the substrates which have been processed in the processing chamber 1.

If the lamp 34 is an infrared one, the substrates are heated by the lamp to degas under vacuum the chlorine ions and the like absorbed on surfaces of the substrates. If the lamp 34 is an ultraviolet one, it is possible to remove photoresist masks on etched substrates by introducing an active gas such as ozone through a gas line 38.

Moreover, the radio frequency voltage from the radio frequency power source 33 is applied to the third electrode 32 in the load-lock chamber 2 and an active gas including fluorine, or oxygen and the like is introduced through the gas line 38 to produce plasma for effecting the aftertreatment simultaneously. This procedure is particularly essential for improving prevention of the aftercorrosion after etching of aluminium substrates. As the load-lock chamber 2 is maintained at a predetermined pressure by the second evacuating system during this processing, the vacuum transferring chamber 4 can be maintained at a predetermined pressure by means of the first evacuating system 31 provided at the processing chamber 1.

As above described, according to the invention when substrates are introduced into or removed from the load-lock chamber 2, the vacuum transferring chamber 52, the load-lock chamber 2 and the processing chamber 1 are completely separated and the opening for introducing substrates into and removing out of the apparatus is only one at the load-lock chamber 2, so that there is no risk of the processing chamber 1 and the vacuum transferring chamber 52 being contaminated by entrance of the air.

Moreover, the substance transferring mechanism 48 for transferring substrates between the load-lock chamber 2 and the processing chamber 1 is arranged as a whole in the vacuum transferring chamber 52 without being distributed in the load-lock chamber 2 and the processing chamber 1, the arrangement of the apparatus is remarkably simplified in its entirety. Therefore, there is an advantage in eliminating the complicated and troublesome operation for adjusting substrate transferring mechanisms distributed in respective chambers as in the prior art. Moreover, as the processing vessel 8 of the processing chamber 1 is detachable, it may be replaced with another processing vessel 8 for a different processing. Accordingly, modification of the apparatus can be very easily effected dependent upon different processings without requiring any complicated and troublesome operation as in the prior art.

In this case, the processing vessel 8 is urged against the surface of the upper wall 5 of the vacuum transferring chamber 52 by the difference in pressure between the processing chamber 1 and the atmosphere during the evacuation of the processing chamber 1, so that the mechanical construction of the mounting mechanism of the processing vessel 8 can be simplified. Moreover, as the displacement, maintenance and inspection of the processing chamber 1 are carried out under the isolated condition from the load-lock chamber 2 and the vacuum transferring chamber 52, the time required to restore the vacuum condition of the apparatus as a whole can be shortened after completion of the above displacement, maintenance and inspection of the processing chamber 1.

Moreover, although the radio frequency power is applied to the first electrode 16 and the direct current is applied to the second electrode 25 in the above embodiment, the direct current may be applied to the first electrode and the frequency power may be applied to the second electrode.

With the apparatus having the construction and operation as above described according to the invention, there is no risk of the processing and the vacuum transferring chambers being contaminated by the air when the substrates are introduced into and removed from the load-lock chamber, so that high quality substrate vacuum processing can be accomplished with high reproducibility. Moreover, as all the substrates in the substrate holder 3 can be accommodated together in the load-lock chamber, it need not be opened to the atmosphere every time the substrates are transferred one by one. There is only one opening through which the substrates are transferred into or out of the apparatus. It is therefore possible to shorten the time required to evacuate the load-lock chamber and to prevent losing the vacuum in the processing chamber, thereby improving the efficiency of the substrate processing.

Moreover, as the load-lock chamber is able to carry out an aftertreatment, substrates can be continuously processed in the vacuum before they are exposed to the atmosphere, thereby considerably improving the yield rate.

Furthermore, the processing chamber can be very easily modified by replacing it with other processing chambers, so that the apparatus according to the invention can be effectively used for multipurpose applications.

While the invention has been particularly shown and described with reference to preferred embodiments thereof, it will be understood by those skilled in the art that the foregoing and other changes in form and details can be made therein without departing from the spirit and scope of the invention.

What is claimed is:

1. A vacuum processing apparatus including a load-lock chamber, a vacuum transferring chamber and a processing chamber, respectively, having gas evacuating means, said load-lock chamber adapted to receive a plurality of substrates from outside of the apparatus, and feed therefrom the substrates into said vacuum transferring chamber, receive processed substrates from said vacuum transferring chamber, and transferring therefrom the processed substrates from the apparatus, said processing chamber being adapted to receive said substrates from said vacuum transferring chamber, process the substrates, and feed therefrom the processed substrates into said vacuum transferring chamber, wherein said load-lock chamber comprises first isolating valve means for isolating and communicating between an inside of said load-lock chamber and the outside of the apparatus and second isolation valve means for isolating and communicating between the inside of the load-lock chamber and an inside of the vacuum transferring chamber, and said processing chamber comprises a vessel detachably secured to a wall of said vacuum transferring chamber and located at an arranging aperture formed in said wall of said vacuum transferring chamber and closing said arranging aperture in an air-tight manner from the outside of the apparatus, and a substrate arranging portion disposed in said vacuum transferring chamber in opposition to said vessel and movable toward and away from said vessel to form an air-tight chamber space in said vessel isolated from said vacuum transferring chamber when said substrate arranging portion has moved to said vessel, and wherein said vacuum transferring chamber comprises therein substrate transferring means for transferring the substrates and processed substrates along transferring passages in the vacuum transferring chamber and said substrate arranging portion comprises substrate lifter means for moving the substrates between said transferring passages and said substrate arranging portion.

2. A vacuum processing apparatus as set forth in claim 1, wherein said substrate lifter means comprises an upward pushing plate located in a recess formed in an upper surface of one electrode of said substrate arranging portion for arranging a substrate thereon, and an upward pushing rod connected to said upward pushing plate extending through said one electrode.

3. A vacuum processing apparatus as set forth in claim 1, wherein said substrate arranging portion is provided with an electrode to which electric power selected from direct current power and alternate current power is applied .

4. A vacuum processing apparatus as set forth in claim 1, wherein said load-lock chamber is provided with heating means for heating the substrates.

5. A vacuum processing apparatus as set forth in claim 1, wherein said load-lock chamber is provided with discharge producing means for plasma processing.

6. A vacuum processing apparatus as set forth in claim 1, wherein said load-lock chamber is provided with heating means for heating the substrates and discharge producing means for plasma processing.

* * * * *

UNITED STATES PATENT AND TRADEMARK OFFICE
CERTIFICATE OF CORRECTION

PATENT NO. : 4,816,638
DATED      : March 28, 1989
INVENTOR(S): Katsumi Ukai, et al.

It is certified that error appears in the above-identified patent and that said Letters Patent is hereby corrected as shown below:

In the Title of the Invention, change "LATCH" to --BATCH--.

In the Abstract, line 1, change "comprising" to --comprises--.

In the Abstract, line 15, delete "be".

Column 5, line 46, change "therewith" to --therein with--.

Signed and Sealed this

Seventeenth Day of October, 1989

Attest:

DONALD J. QUIGG

Attesting Officer

Commissioner of Patents and Trademarks